(12) United States Patent
Kim

(10) Patent No.: US 8,053,971 B2
(45) Date of Patent: Nov. 8, 2011

(54) ORGANIC LIGHT EMITTING DEVICE AND METHOD OF FABRICATING THE SAME

(75) Inventor: Chang Nam Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 11/830,250

(22) Filed: Jul. 30, 2007

(65) Prior Publication Data

US 2008/0024057 A1    Jan. 31, 2008

(30) Foreign Application Priority Data

Jul. 31, 2006 (KR) .................. 10-2006-0072421
Sep. 18, 2006 (KR) .................. 10-2006-0090339

(51) Int. Cl.
*H01L 51/50* (2006.01)
*H01L 51/52* (2006.01)

(52) U.S. Cl. ................ 313/503; 313/504; 313/506

(58) Field of Classification Search .......... 313/500–512; 257/72.98–100
See application file for complete search history.

(56) References Cited

U.S. PATENT DOCUMENTS

| 5,820,996 | A * | 10/1998 | Hirai et al. | 313/503 |
| 6,812,637 | B2 * | 11/2004 | Cok et al. | 313/503 |
| 6,869,635 | B2 * | 3/2005 | Kobayashi | 313/504 |
| 2002/0033664 | A1 * | 3/2002 | Kobayashi | 313/504 |
| 2002/0158835 | A1 | 10/2002 | Kobayashi et al. | |
| 2003/0137325 | A1 * | 7/2003 | Yamazaki et al. | 327/80 |
| 2003/0183830 | A1 * | 10/2003 | Yamazaki et al. | 257/90 |
| 2004/0263441 | A1 | 12/2004 | Tanaka et al. | |
| 2005/0057151 | A1 | 3/2005 | Kuwabara | |

FOREIGN PATENT DOCUMENTS

| EP | 1 343 206 A2 | 9/2003 |
| JP | 10335068 A * | 12/1998 |
| JP | 2003123988 A * | 4/2003 |

\* cited by examiner

*Primary Examiner* — Mariceli Santiago

(74) *Attorney, Agent, or Firm* — Morgan, Lewis & Bockius LLP

(57) ABSTRACT

An organic light emitting device and a method of fabricating the same are disclosed. The organic light emitting device includes a substrate, a first electrode positioned on the substrate, an insulating layer that is positioned on the first electrode and includes an opening exposing a portion of the first electrode, an organic emissive layer positioned inside the opening, a second electrode positioned on the organic emissive layer, and an auxiliary electrode that is positioned on or under the insulating layer and electrically connected to the second electrode.

8 Claims, 12 Drawing Sheets

ORGANIC LIGHT EMITTING DEVICE AND METHOD OF FABRICATING THE SAME

CROSS-REFERENCE TO RELATED APPLICATION

This application claims the benefit of Korean Patent Application Nos. 10-2006-0072421 and 10-2006-0090339 filed in Korea on Jul. 31, 2006 and Sep. 18, 2006, which is hereby incorporated by reference.

BACKGROUND

1. Field

Exemplary embodiments of the present invention relate to an organic light emitting device and a method of fabricating the same.

2. Description of the Related Art

Out of flat panel display devices, an organic light emitting device is a self-emissive type device for emitting light due to an electrical excitation of an organic compound. Because the organic light emitting device does not need a backlight unit used in a liquid crystal display, it can be fabricated to be thin and light through a simple fabrication process. The organic light emitting device can be fabricated in low temperature environment. Furthermore, the organic light emitting device has various characteristics such as rapid response time, low power consumption, a wide viewing angle, and high contrast.

The organic light emitting device includes an organic emissive layer between an anode electrode and a cathode electrode. The organic light emitting device forms an exciton, which is a hole-electron pair, by combining holes received from the anode electrode and electrons received from the cathode electrode inside the organic emissive layer, and emits light by energy generated when the exciton returns to a ground level.

The organic light emitting device includes a plurality of pixels including red, green and blue organic emissive layers so as to achieve full color representation. The red, green and blue organic emissive layers can be patterned through a vacuum deposition method.

FIG. 1 is a cross-sectional view of a related art organic light emitting device.

As illustrated in FIG. 1, a thin film transistor T is positioned on a substrate 100. The thin film transistor T includes a semiconductor layer 105, a first insulating layer 110 that is a gate insulating layer, a gate electrode 115, a second insulating layer 120 that is an interlayer insulating layer, a source electrode 125a, and a drain electrode 125b.

A third insulating layer 130 may be positioned on the thin film transistor T for planarization or passivation. An organic light emitting diode including a first electrode 140, an organic emissive layer 170, and a second electrode 180 is positioned in the third insulating layer 130.

The first electrode 140 is formed in each pixel, and electrically connected to the drain electrode 125b through the third insulating layer 130. A fourth insulating layer 150 including an opening 155 may be positioned on the first electrode 140. The opening 155 provides an electrical insulation between the first electrodes 140, and exposes a portion of the first electrode 140. The organic emissive layer 170 is positioned inside the opening 155. The organic emissive layer 170 may include red, green and blue organic emissive layers, and may be patterned in each pixel through a vacuum deposition method using a shadow mask. The second electrode 180 is positioned on the substrate 100 including the organic emissive layer 170, and formed in the form of a front electrode.

An organic light emitting device may be classified into a bottom emissive type device, a top emissive type device, and a dual emissive type device based on a traveling direction of light produced by an organic light emitting diode. Because light travels in an opposite direction to a substrate in a top emissive type organic light emitting device, a second electrode is formed of a transparent conductive film such as indium-tin-oxide (ITO) or a thin metal film so as to transmit light.

However, when the second electrode of the top emissive type organic light emitting device is formed as illustrated in FIG. 1, a surface resistance of the second electrode increases. Furthermore, because the second electrode is formed in the form of a common electrode in FIG. 1, signals transmitted to each pixel are delayed by the increased surface resistance of the second electrode. This results in non-uniformity of a luminance of each pixel. In particular, the delay of signals transmitted to each pixel increases in a large-sized organic light emitting device, and thus, it is difficult to display a desired image.

SUMMARY

In one aspect, an organic light emitting device comprises a substrate, a first electrode positioned on the substrate, an insulating layer that is positioned on the first electrode and includes an opening exposing a portion of the first electrode, an organic emissive layer positioned inside the opening, a second electrode positioned on the organic emissive layer, and an auxiliary electrode that is positioned on or under the insulating layer and electrically connected to the second electrode.

In another aspect, a method of fabricating an organic light emitting device comprises preparing a substrate, forming a first electrode on the substrate, forming an insulating layer, that includes an opening exposing a portion of the first electrode, on the first electrode, forming an auxiliary electrode on the insulating layer except the opening, forming an organic emissive layer on the insulating layer including the opening to expose at least a portion of the auxiliary electrode, and forming a second electrode on the substrate including the organic emissive layer and the auxiliary electrode.

In still another aspect, a method of fabricating an organic light emitting device comprises preparing a substrate, forming first electrodes on the substrate and an auxiliary electrode between the first electrodes to be spaced apart from the first electrode, forming an insulating layer, that includes an opening exposing a portion of the first electrode and a via hole exposing a portion of the auxiliary electrode, on the first electrode and the auxiliary electrode, forming an organic emissive layer on the insulating layer including the opening to expose at least a portion of the via hole, and forming a second electrode on the substrate including the organic emissive layer to be electrically connected to the auxiliary electrode through the via hole.

It is to be understood that both the foregoing general description and the following detailed description are exemplary and explanatory and are intended to provide further explanation of the invention as claimed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
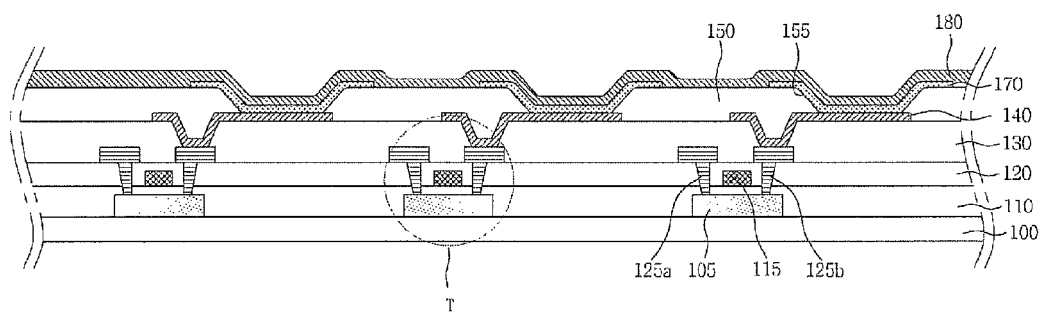
FIG. 1 is a cross-sectional view of a related art organic light emitting device.
Figure 2:
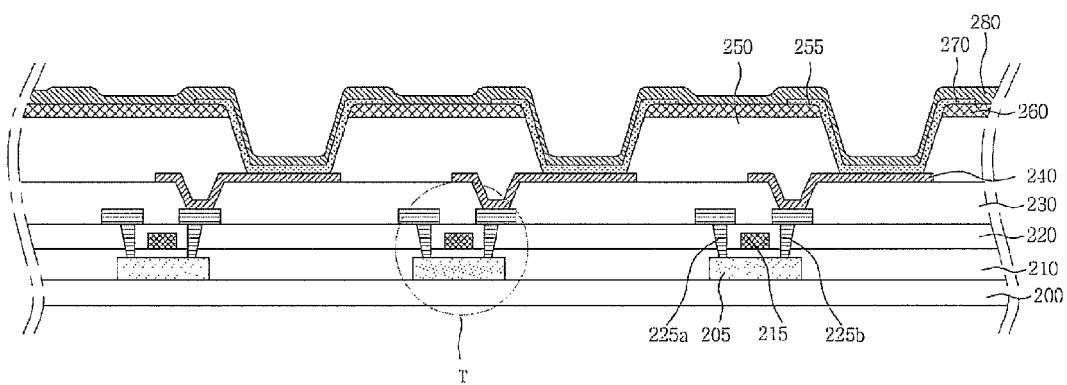
FIG. 2 is a cross-sectional view of an organic light emitting device according to a first exemplary embodiment.

FIG. 2 is a cross-sectional view of an organic light emitting device according to a first exemplary embodiment.

As illustrated in FIG. 2, a thin film transistor T is positioned on a substrate 200. The thin film transistor T includes a semiconductor layer 205, a first insulating layer 210, a gate electrode 215, a second insulating layer 220, a source electrode 225a, and a drain electrode 225b.

A third insulating layer 230 is positioned on the source electrode 225a and the drain electrode 225b. The third insulating layer 230 may be an insulating layer for planarization or passivation. A first electrode 240 is positioned on the third insulating layer 230, and electrically connected to the drain electrode 225b through the third insulating layer 230.

A fourth insulating layer 250 including an opening 255 is positioned on the first electrode 240. The fourth insulating layer 250 may be a pixel definition layer. The opening 255 provides an electrical insulation between the first electrodes 240, and exposes a portion of the first electrode 240.

An auxiliary electrode 260 is positioned on the fourth insulating layer 250 except the opening 255. The auxiliary electrode 260 may be formed of one or more metal layers having a low resistance. The auxiliary electrode 260 may be formed of at least one selected from the group consisting of chromium (Cr), aluminium (Al), molybdenum (Mo), copper (Cu), tungsten (W), silver (Ag), nickel (Ni), gold (Au), and an alloy thereof. Any one metal layer constituting the auxiliary electrode 260 may be formed of Cr. Furthermore, the auxiliary electrode 260 may further include a metal oxide layer. The metal oxide layer may include chromium oxide (CrOx). When the auxiliary electrode 260 includes a metal oxide layer, an uppermost layer of the auxiliary electrode 260 is a metal layer.

An organic emissive layer 270 is positioned inside the opening 255 to expose at least a portion of the auxiliary electrode 260. The organic emissive layer 270 may be formed of an organic material.

A second electrode 280 is positioned on the substrate 200 including the organic emissive layer 270 and the auxiliary electrode 260. The second electrode 280 may be an anode electrode. The second electrode 280 is formed in the form of a front electrode, and electrically connected to the organic emissive layer 270 and the auxiliary electrode 260 formed in each pixel.

FIGS. 3A to 7B are plane views and cross-sectional views illustrating each stage in a method of fabricating the organic light emitting device according to the first exemplary embodiment. FIGS. 3B, 4B, 5B, 6B and 7B are cross-sectional views taken along line I-I' of FIGS. 3A, 4A, 5A, 6A and 7A that are plane views.

Figure 3A:
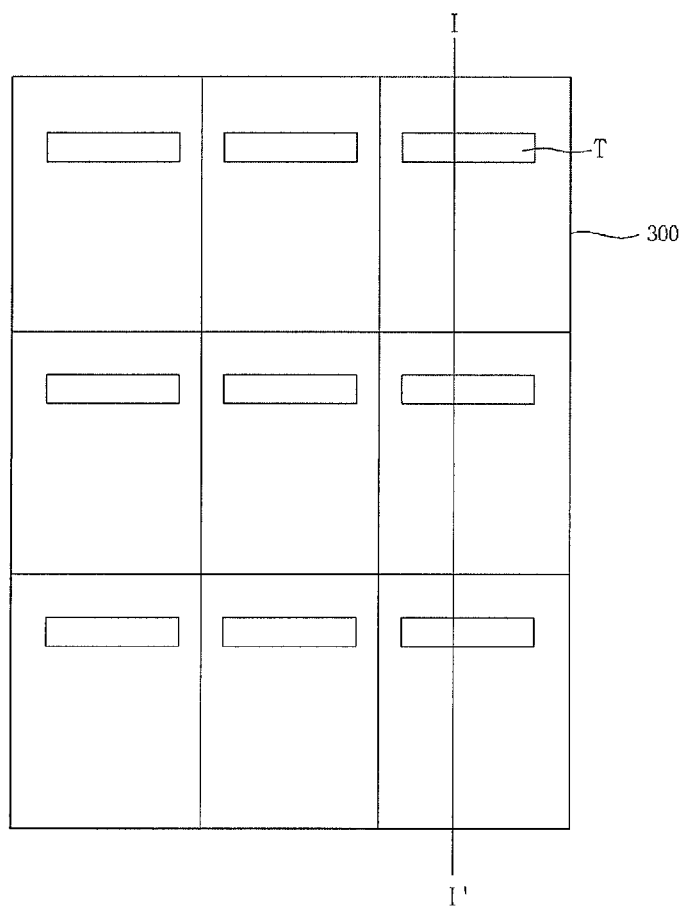
FIGS. 3A to 7B are plane views and cross-sectional views illustrating each stage in a method of fabricating the organic light emitting device according to the first exemplary embodiment.
Figure 3B:
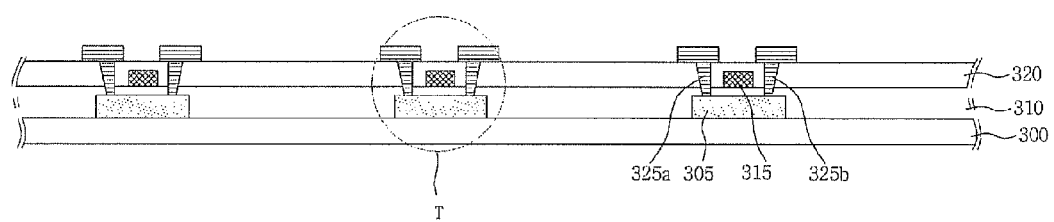

As illustrated in FIGS. 3A and 3B, a semiconductor layer 305 formed of amorphous silicon or poly-silicon is formed on a substrate 300. A first insulating layer 310 that is a gate insulating layer is formed on the substrate 300 including the semiconductor layer 305, and a gate electrode 315 is then formed on the first insulating layer 310 to correspond to a portion of the semiconductor layer 305. The gate electrode 315 may be formed of Al, Al alloy, Mo, Mo alloy, W or tungsten silicide ($WSi_2$).

A second insulating layer 320 that is an interlayer insulating layer is formed on the gate electrode 315. A source electrode 325a and a drain electrode 325b are then formed on the second insulating layer 320 to be electrically connected to the semiconductor layer 305 through the first and second insulating layers 310 and 320. The source electrode 325a and the drain electrode 325b may be formed of a low resistance material capable of reducing an interconnect resistance, for example, MoW, titanium (Ti), Al, or Al alloy. Hence, a thin film transistor T including the semiconductor layer 305, the first insulating layer 310, the gate electrode 315, the second insulating layer 320, the source electrode 325a, and the drain electrode 325b is formed.

Figure 4A:
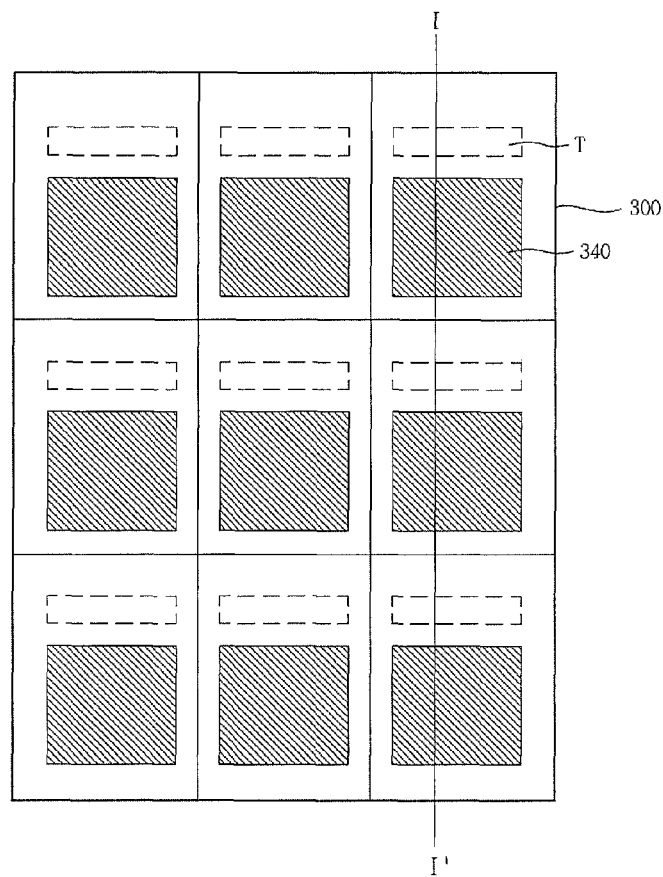
Figure 4B:
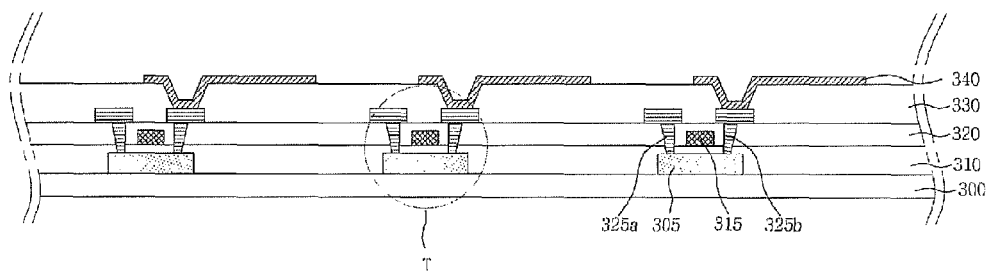

As illustrated in FIGS. 4A and 4B, a third insulating layer 330 is formed on the source electrode 325a and the drain electrode 325b. The third insulating layer 330 may be an insulating layer for planarization or passivation. The third insulating layer 330 may formed of polyimide-based resin, polyacryl-based resin, benzocyclobutene-based resin, silicon nitride or silicon oxide.

A first electrode 340 is formed on the third insulating layer 330, and electrically connected to the drain electrode 325b through the third insulating layer 330. The first electrode 340 may be a cathode electrode. The first electrode 340 may formed of magnesium (Mg), silver (Ag), aluminium (Al), chromium (Cr), calcium (Ca), or an alloy thereof.

Figure 5A:
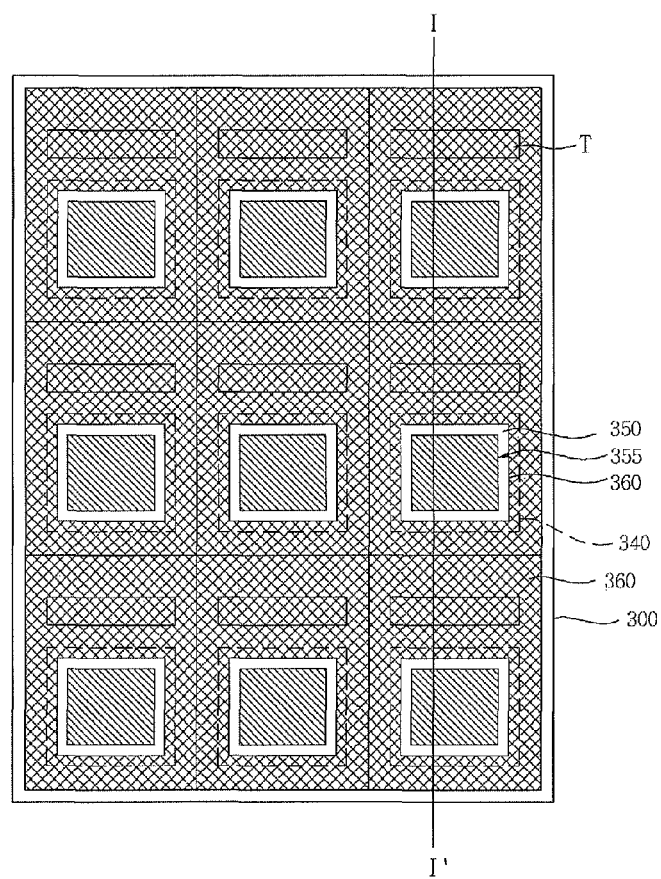
Figure 5B:
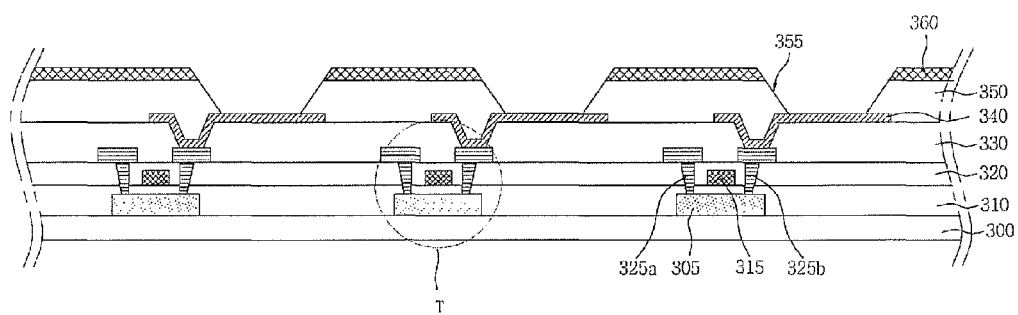

As illustrated in FIGS. 5A and 5B, a fourth insulating layer 350 is formed on the first electrode 340 to provide an electrical insulation between the first electrodes 340. The fourth insulating layer 350 may be a pixel definition layer. A photolithographic etching process is performed on the fourth insulating layer 350 to etch the fourth insulating layer 350. Hence, an opening 355 is formed inside the fourth insulating layer 350 to expose a portion of the first electrode 340.

An auxiliary electrode 360 is formed on the fourth insulating layer 350. The auxiliary electrode 360 may be formed by stacking a metal layer for auxiliary electrode on the fourth insulating layer 350 and then patterning the metal layer for auxiliary electrode using a photolithographic etching process.

The auxiliary electrode 360 may be formed of one or more metal layers having a low resistance. The auxiliary electrode 360 may be formed of at least one selected from the group consisting of chromium (Cr), aluminium (Al), molybdenum (Mo), copper (Cu), tungsten (W), silver (Ag), nickel (Ni), gold (Au), and an alloy thereof.

Any one metal layer constituting the auxiliary electrode 360 may be formed of Cr. When the auxiliary electrode 360 includes a metal layer formed of Cr, the auxiliary electrode 360 can performs a function of a black matrix. Accordingly, a contrast ratio of the organic light emitting device can increase.

Furthermore, the auxiliary electrode 360 may further include a metal oxide layer. The metal oxide layer may include chromium oxide (CrOx). When the auxiliary electrode 360 includes a metal oxide layer formed of CrOx, the metal oxide layer can performs a function of a black matrix. To simultaneously perform functions of an auxiliary electrode and a black matrix, the auxiliary electrode 360 includes an uppermost layer formed of the metal layer and a lower layer formed of the metal oxide layer.

Although the opening 355 and the auxiliary electrode 360 are sequentially formed in the first exemplary embodiment, the opening 355 and the auxiliary electrode 360 may be simultaneously formed by stacking the metal layer for auxiliary electrode on the fourth insulating layer 350 and then performing a halftone mask process.

Figure 6A:
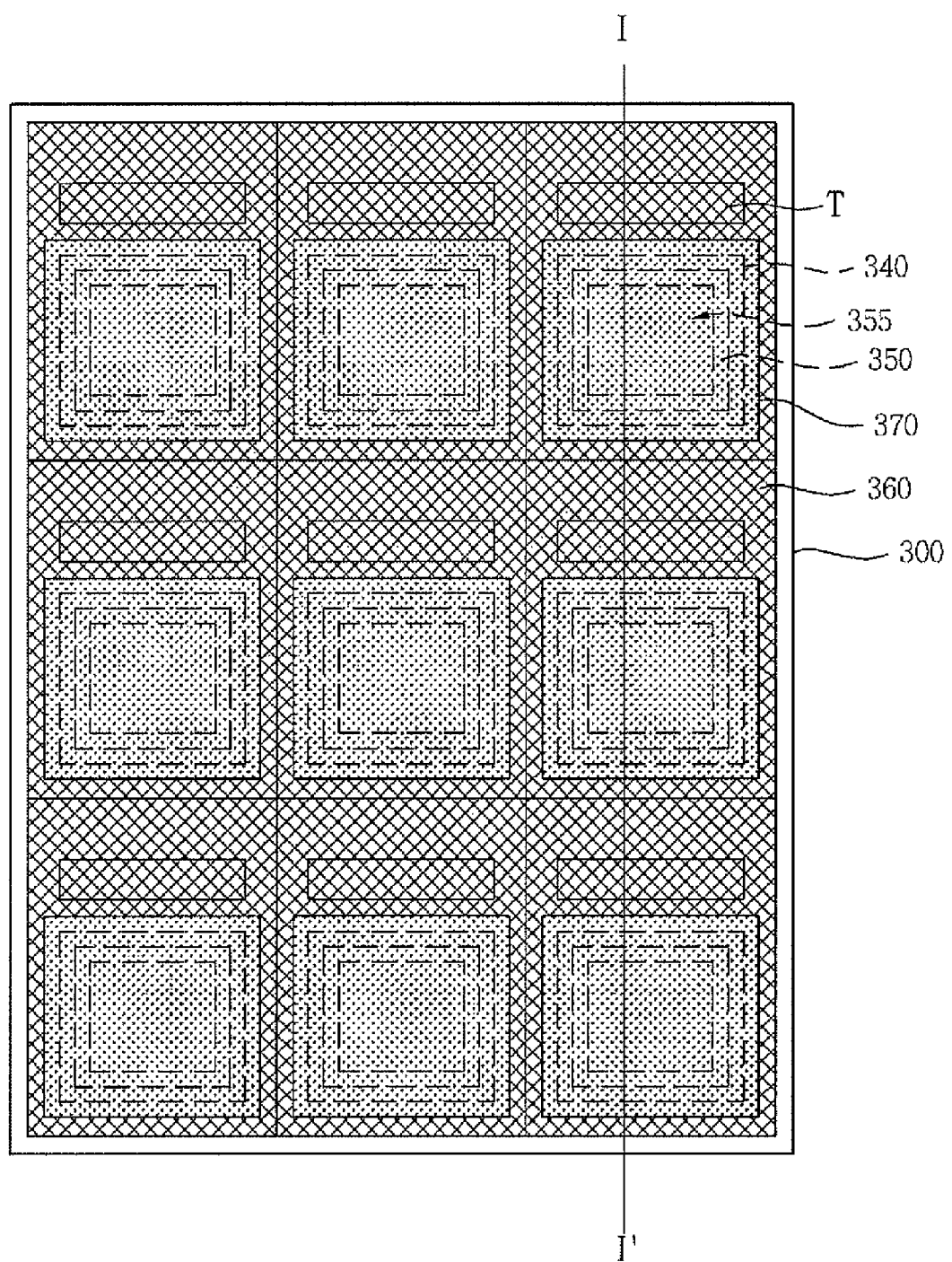
Figure 6B:
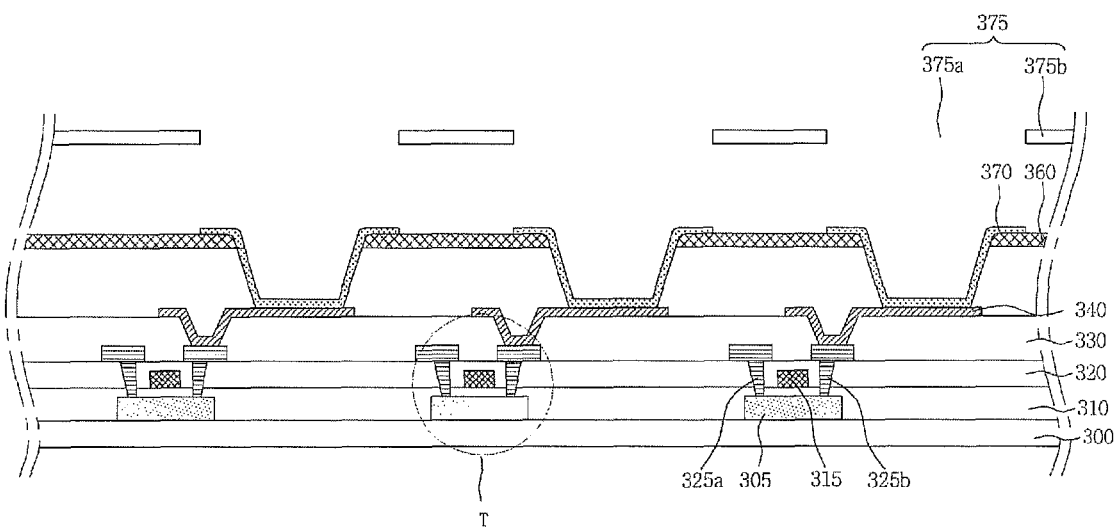

As illustrated in FIGS. 6A and 6B, an organic emissive layer 370 is formed inside the opening 355. The organic emissive layer 370 may be formed of an organic material. Although it is not shown, an electron injecting layer and/or an electron transporting layer may be formed between the organic emissive layer 370 and the first electrode 340. Furthermore, a hole transporting layer and/or a hole injecting layer may be formed on the organic emissive layer 370.

The organic emissive layer 370 may include red, green and blue organic emissive layers. The organic emissive layer 370 may formed through a vacuum deposition method using a shadow mask 375. The shadow mask 375 includes a transmitting portion 375a and a blocking portion 375b to deposit an organic material on a desired area. The organic emissive layer 370 is formed to expose a portion of the auxiliary electrode 360, because the auxiliary electrode 360 is electrically connected to a second electrode, which will be formed later. Accordingly, the blocking portion 375b of the shadow mask 375 is positioned in an area corresponding to at least a portion of the auxiliary electrode 360 when the shadow mask 375 and the substrate 300 are aligned.

Figure 7A:
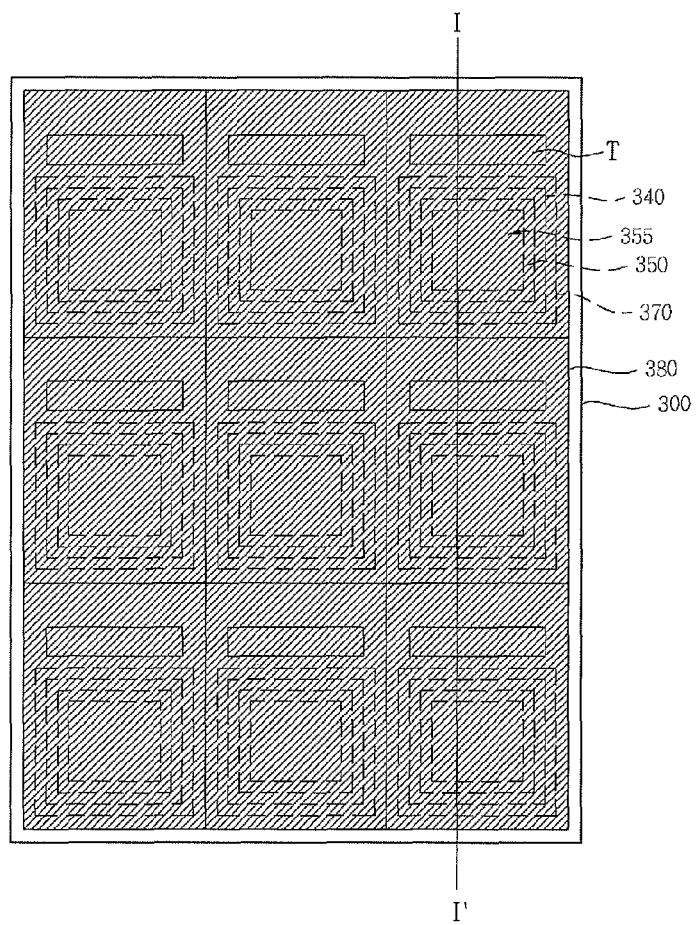
Figure 7B:
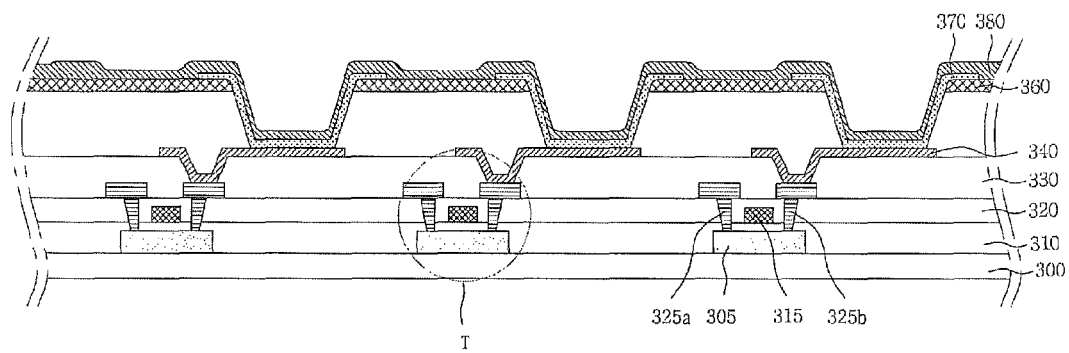

As illustrated in FIGS. 7A and 7B, a second electrode 380 is formed on the substrate 300 including the organic emissive layer 370 and the auxiliary electrode 360. The second electrode 380 may be an anode electrode. The second electrode 380 may be formed of a transparent conductive film having a high work function such as indium-tin-oxide (ITO), indium-zinc-oxide (IZO), indium-cerium-oxide (ICO), or zinc oxide (ZnO). Otherwise, the second electrode 380 may be formed in the form of a thin film using Mg, Ag, Al, and the like. In this case, the second electrode 380 may further include a transparent conductive film so as to control a work function. The second electrode 380 is not patterned in each pixel, and is formed in the form of a common electrode on the substrate 300.

In the first exemplary embodiment, the second electrode 380 is electrically connected to the auxiliary electrode 360 positioned on the fourth insulating layer 350. Because the auxiliary electrode 360 is formed of a metal material having a low resistance, the auxiliary electrode 360 reduces the surface resistance of the second electrode 380 formed of the transparent conductive film or the thin conductive film. Accordingly, the organic light emitting device according to the first exemplary embodiment prevents signal delay by the reduced surface resistance of the second electrode 380 during the driving of the organic light emitting device, thereby maintaining uniformity of luminance in each pixel.

When the auxiliary electrode 360 is formed of multiple layers including Cr or CrOx, the auxiliary electrode 360 can simultaneously perform functions of an auxiliary electrode and a black matrix. Accordingly, visibility of the organic light emitting device improves.

Furthermore, because the patterning of the auxiliary electrode 360 according to the first exemplary embodiment is simultaneous with the formation of the opening 355 of the fourth insulating layer 350, the auxiliary electrode 360 according to the first exemplary embodiment can formed through a simple process without a separate mask.

Figure 8:
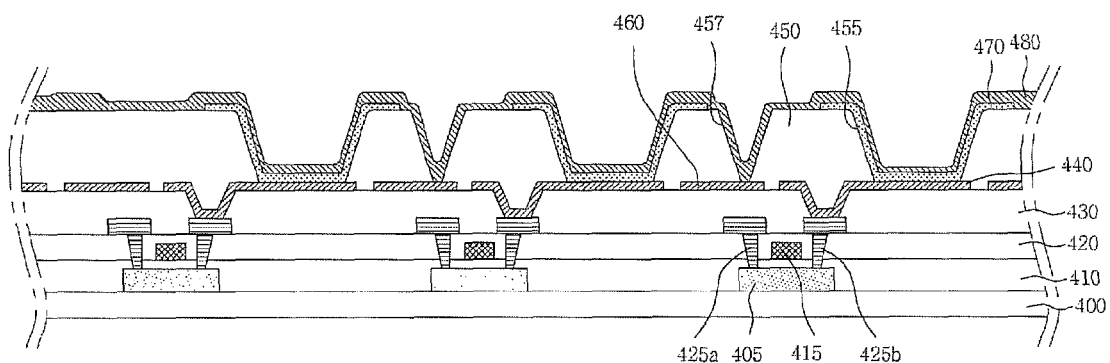
FIG. 8 is a cross-sectional view of an organic light emitting device according to a second exemplary embodiment.

FIG. 8 is a cross-sectional view of an organic light emitting device according to a second exemplary embodiment.

As illustrated in FIG. 8, a thin film transistor T is positioned on a substrate 400. The thin film transistor T includes a semiconductor layer 405, a first insulating layer 410, a gate electrode 415, a second insulating layer 420, a source electrode 425a, and a drain electrode 425b.

A third insulating layer 430 is positioned on the source electrode 425a and the drain electrode 425b. The third insulating layer 430 may be an insulating layer for planarization or passivation. A first electrode 440 is positioned on the third insulating layer 430, and electrically connected to the drain electrode 425b through the third insulating layer 430.

The first electrode 440 may be patterned in each pixel, and an auxiliary electrode 460 is positioned between the first electrodes 440. The first electrode 440 and the auxiliary electrode 460 may be formed on the same plane by stacking a predetermined metal layer on the third insulating layer 430 and then patterning the predetermined metal layer. Because the auxiliary electrode 460 is electrically connected to a second electrode which will be formed later, the auxiliary electrode 460 is spaced apart from the first electrode 440 so as to prevent short-circuit between the first electrode 440 and the second electrode.

The auxiliary electrode 460 may be formed of one or more metal layers having a low resistance. The auxiliary electrode 460 may be formed of at least one selected from the group consisting of Cr, Al, Mo, Cu, W, Ag, Ni, Au, and an alloy thereof. Any one metal layer constituting the auxiliary electrode 460 may be formed of Cr. Furthermore, the auxiliary electrode 460 may further include a metal oxide layer. The metal oxide layer may include CrOx. When the auxiliary electrode 460 includes a metal oxide layer formed of CrOx, an uppermost layer of the auxiliary electrode 460 is a metal layer.

A fourth insulating layer 450 is positioned on the first electrode 440 and the auxiliary electrode 460. The fourth insulating layer 450 may be a pixel definition layer. The fourth insulating layer 450 includes an opening 455 and a via hole 457. The opening 455 provides an electrical insulation between the first electrodes 440, and exposes a portion of the first electrode 440. The via hole 457 exposes a portion of the auxiliary electrode 460.

An organic emissive layer 470 is positioned inside the opening 455. The organic emissive layer 470 may be formed of an organic material, and include red, green and blue organic emissive layers.

A second electrode 480 is positioned on the organic emissive layer 470 and the auxiliary electrode 460 exposed through the via hole 457. The second electrode 480 may be an anode electrode. The second electrode 480 is formed in the form of a front electrode, and electrically connected to the organic emissive layer 470 and the auxiliary electrode 460 formed in each pixel.

Figure 9A:
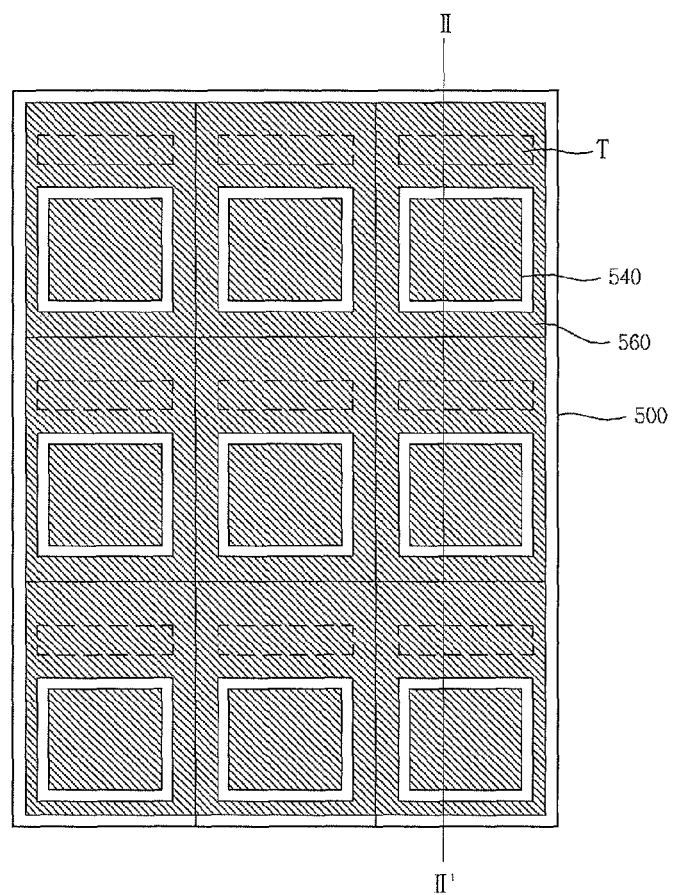
FIGS. 9A to 11B are plane views and cross-sectional views illustrating each stage in a method of fabricating the organic light emitting device according to the second exemplary embodiment.
Figure 9B:
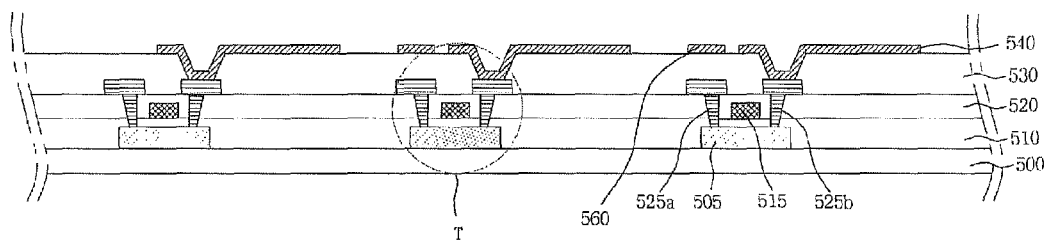
Figure 10A:
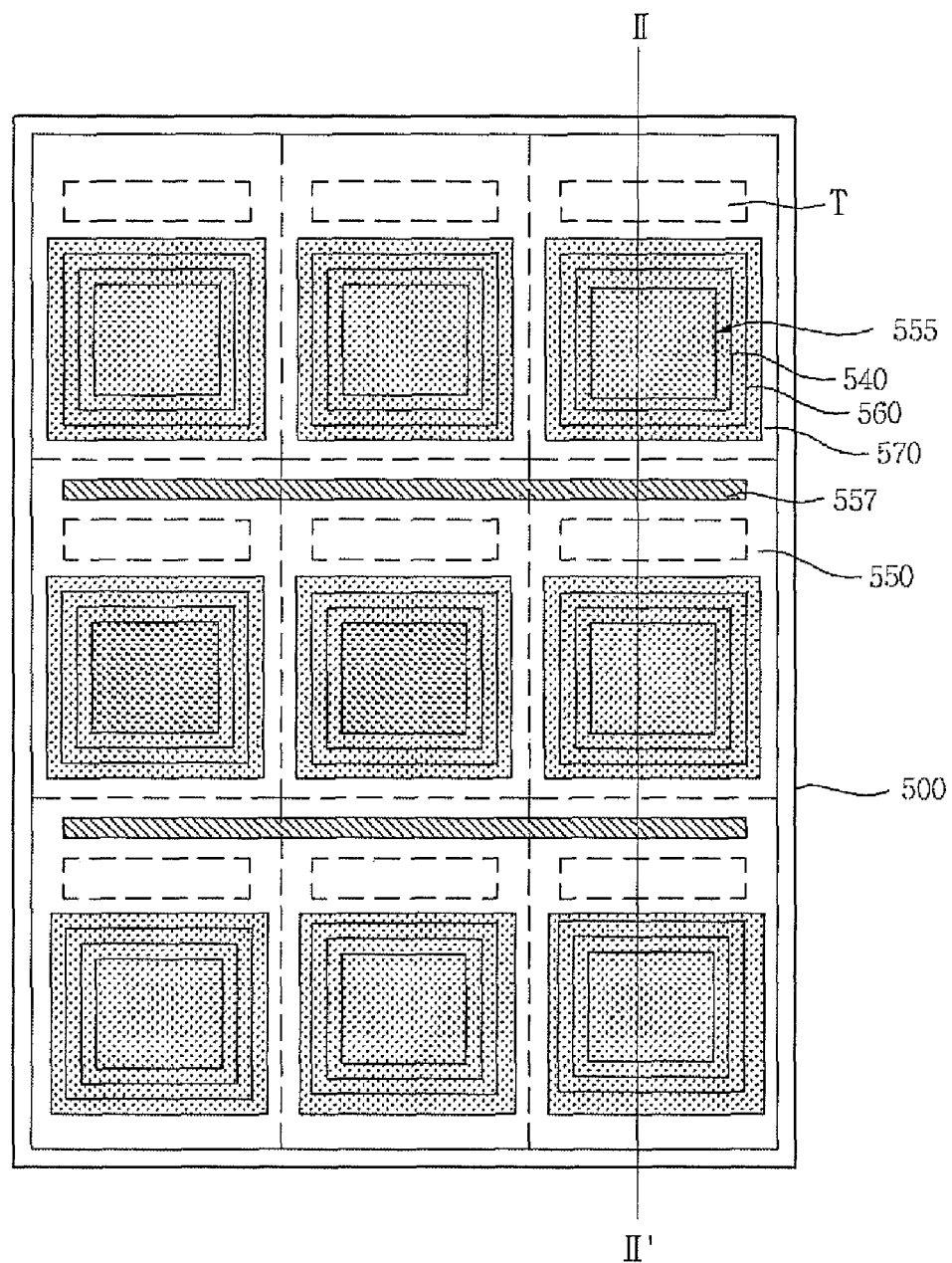
Figure 10B:
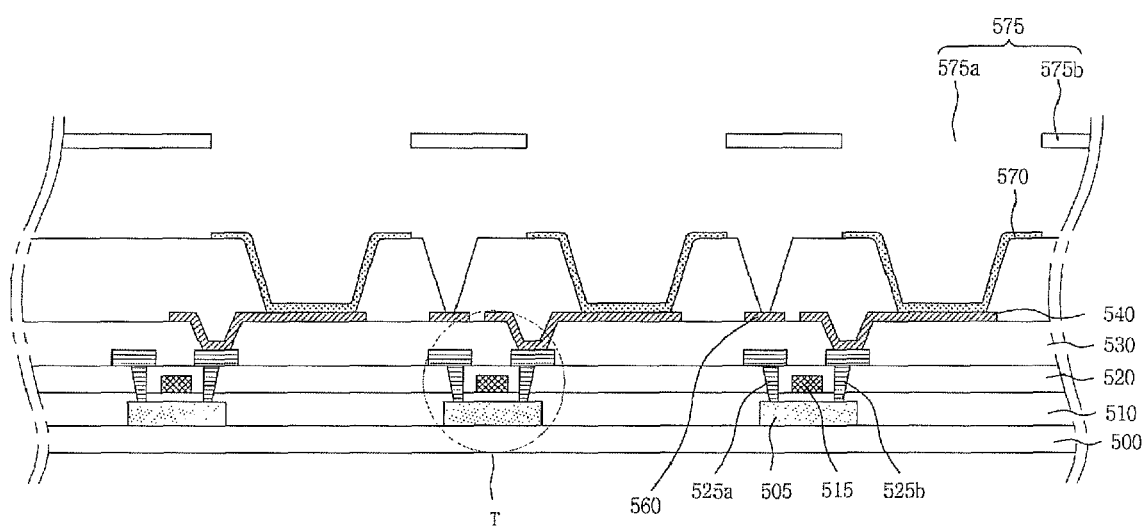
Figure 11A:
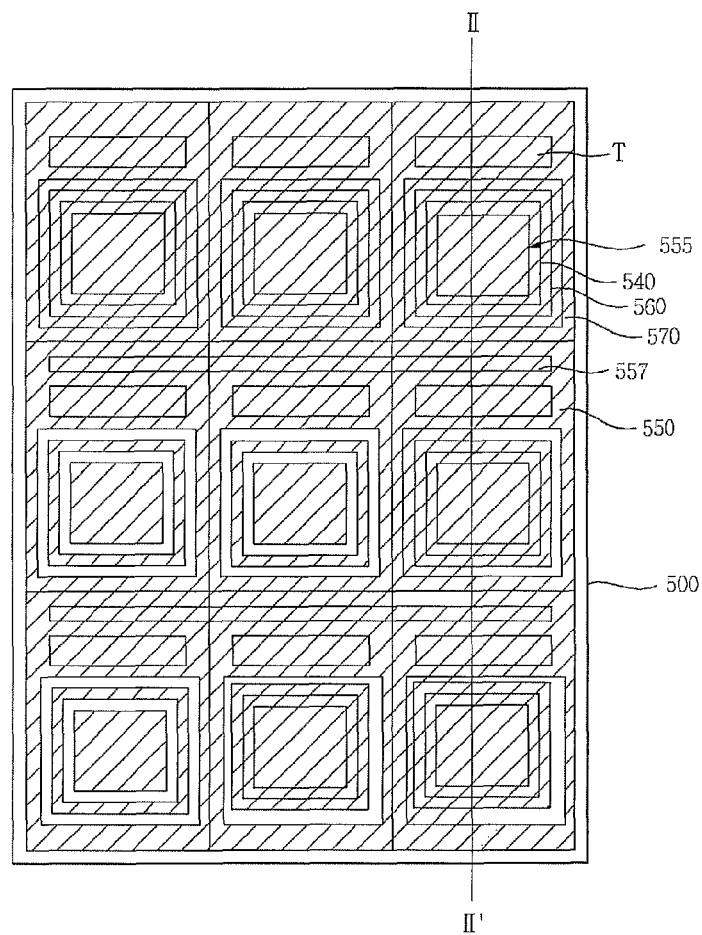
Figure 11B:
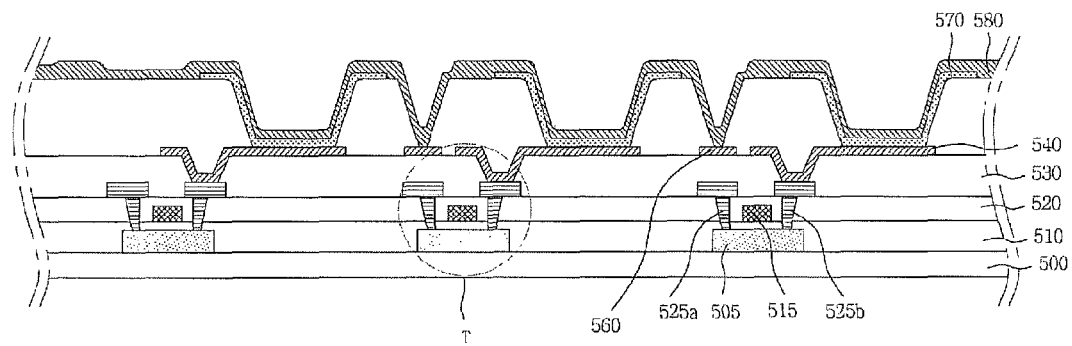

FIGS. 9A to 11B are plane views and cross-sectional views illustrating each stage in a method of fabricating the organic light emitting device according to the second exemplary embodiment. FIGS. 9B, 10B and 11B are cross-sectional views taken along line II-II' of FIGS. 9A, 10A and 11A that are plane views.

As illustrated in FIGS. 9A and 9B, a thin film transistor T including a semiconductor layer 505, a first insulating layer 510, a gate electrode 515, a second insulating layer 520, a source electrode 525a and a drain electrode 525b is formed on a substrate 500.

A third insulating layer 530 is formed on the source electrode 525a and the drain electrode 525b.

A first electrode 540 and an auxiliary electrode 560 are simultaneously formed on the third insulating layer 530. The first electrode 540 is formed by stacking a metal layer on the third insulating layer 530 and then etching the metal layer, and is electrically connected to the drain electrode 525b through the third insulating layer 530. The auxiliary electrode 560 is positioned between the first electrodes 540 to be spaced apart from the first electrode 540. Accordingly, the auxiliary electrode 560, as illustrated in FIG. 9A, may have a lattice structure.

The first electrode 540 may be a cathode electrode. The first electrode 540 may be formed of at least one selected from the group consisting of Al, Mo, Cu, W, Ag, Ni, Au, Cr, Ca, and an alloy thereof. The auxiliary electrode 560 may be formed of the same material as the first electrode 540. Otherwise, the auxiliary electrode 560 may include a metal layer formed of the same material as the first electrode 540, and an additional metal layer.

Any one metal layer constituting the auxiliary electrode 560 may be formed of Cr. When the auxiliary electrode 560 includes a metal layer formed of Cr, the auxiliary electrode 560 can performs a function of a black matrix. Accordingly, a contrast ratio of the organic light emitting device can increase.

Furthermore, the auxiliary electrode 560 may further include a metal oxide layer. The metal oxide layer may include CrOx. When the auxiliary electrode 560 includes a metal oxide layer formed of CrOx, the metal oxide layer can performs a function of a black matrix. To simultaneously perform functions of an auxiliary electrode and a black matrix, the auxiliary electrode 560 includes an uppermost layer formed of the metal layer and a lower layer formed of the metal oxide layer.

As above, when the auxiliary electrode 560 has a multi-layered structure, the first electrode 540 and the auxiliary electrode 560 may be simultaneously formed using a halftone mask process.

As illustrated in FIGS. 10A and 10B, a fourth insulating layer 550 is formed on the first electrode 540 and the auxiliary electrode 560 to provide an electrical insulation between the first electrodes 540. The fourth insulating layer 550 may be a pixel definition layer. A photolithographic etching process is performed on the fourth insulating layer 550 to etch the fourth insulating layer 550. Hence, an opening 555 exposing a portion of the first electrode 540 and a via hole 557 exposing a portion of the auxiliary electrode 560 are formed inside the fourth insulating layer 550.

Next, an organic emissive layer 570 is formed inside the opening 555. The organic emissive layer 570 may be formed of an organic material. Although it is not shown, an electron injecting layer and/or an electron transporting layer may be formed between the organic emissive layer 570 and the first electrode 540. Furthermore, a hole transporting layer and/or a hole injecting layer may be formed on the organic emissive layer 570.

The organic emissive layer 570 may include red, green and blue organic emissive layers. The organic emissive layer 570 may formed through a vacuum deposition method using a shadow mask 575. The shadow mask 575 includes a transmitting portion 575a and a blocking portion 575b to deposit an organic material on a desired area. The organic emissive layer 570 is formed to expose a portion of the auxiliary electrode 560, because the auxiliary electrode 560 is electrically connected to a second electrode, which will be formed later. Accordingly, the blocking portion 575b of the shadow mask 575 is positioned in an area corresponding to the via hole 557 exposing at least a portion of the auxiliary electrode 560 when the shadow mask 575 and the substrate 500 are aligned.

As illustrated in FIGS. 11A and 11B, a second electrode 580 is formed on the substrate 500 including the organic emissive layer 570 and the auxiliary electrode 560 exposed by the via hole 557. The second electrode 580 may be an anode electrode. The second electrode 580 may be formed of a transparent conductive film having a high work function such as indium-tin-oxide (ITO), indium-zinc-oxide (IZO), indium-cerium-oxide (ICO), or zinc oxide (ZnO). Otherwise, the second electrode 580 may be formed in the form of a thin film using Mg, Ag, Al, and the like. In this case, the second electrode 580 may further include a transparent conductive film so as to control a work function. The second electrode 580 is not patterned in each pixel, and is formed in the form of a common electrode on the substrate 500.

In the second exemplary embodiment, the second electrode 580 is electrically connected to the auxiliary electrode 560 positioned under the fourth insulating layer 550 through the via hole 557. Because the auxiliary electrode 560 is formed of a metal material having a low resistance, the auxiliary electrode 560 reduces the surface resistance of the second electrode 580 formed of the transparent conductive film or the thin conductive film. Accordingly, the organic light emitting device according to the second exemplary embodiment prevents signal delay by the reduced surface resistance of the second electrode 580 during the driving of the organic light emitting device, thereby maintaining uniformity of luminance in each pixel.

When the auxiliary electrode 560 is formed of multiple layers including Cr or CrOx, the auxiliary electrode 560 can simultaneously perform functions of an auxiliary electrode and a black matrix. Accordingly, visibility of the organic light emitting device improves.

Furthermore, because the patterning of the auxiliary electrode 560 according to the second exemplary embodiment is simultaneous with the patterning of the first electrode 540, the auxiliary electrode 560 according to the second exemplary embodiment can formed through a simple process without a separate mask.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:
a substrate;
a first electrode positioned on the substrate;
an insulating layer that is positioned on the first electrode and includes an opening exposing a portion of the first electrode;
an organic emissive layer positioned inside the opening;
a second electrode positioned on the organic emissive layer; and
an auxiliary electrode that is positioned on the insulating layer and electrically connected to the second electrode, wherein the auxiliary electrode is directly and physically in surface contact with the second electrode, wherein outer end portions of the organic emissive layer are positioned on the auxiliary electrode, wherein the auxiliary electrode includes an uppermost layer formed of a metal layer and a lower layer formed of a metal oxide layer, and wherein the auxiliary electrode that is positioned on a whole surface of the insulating layer except the opening.

2. The organic light emitting device of claim 1, wherein the first electrodes are patterned to be spaced apart from each other in each sub-pixel, and the second electrode is a common electrode.

3. The organic light emitting device of claim 1, wherein the uppermost layer of the auxiliary electrode is formed of at least one selected from the group consisting of chromium (Cr), aluminium (Al), molybdenum (Mo), copper (Cu), tungsten (W), silver (Ag), nickel (Ni), gold (Au), and an alloy thereof.

4. The organic light emitting device of claim 3, wherein the uppermost layer of the auxiliary electrode is formed of Cr.

5. The organic light emitting device of claim 1, wherein the uppermost layer of the auxiliary electrode includes one or more metal oxide layers.

6. The organic light emitting device of claim 5, wherein the metal oxide layer includes chromium oxide (CrOx).

7. The organic light emitting device of claim 1, wherein the first electrode is a cathode, and the second electrode is an anode.

8. The organic light emitting device of claim 1, further comprising a thin film transistor electrically connected to the first electrode.

* * * * *